United States Patent
Cao et al.

(10) Patent No.: US 12,051,469 B2
(45) Date of Patent: *Jul. 30, 2024

(54) METHOD AND APPARATUS TO MITIGATE HOT ELECTRON READ DISTURBS IN 3D NAND DEVICES

(71) Applicant: Intel NDTM US LLC, Santa Clara, CA (US)

(72) Inventors: Wei Cao, Goleta, CA (US); Richard M. Fastow, Cupertino, CA (US); Xuehong Yu, San Jose, CA (US); Xin Sun, Fremont, CA (US); Hyungseok Kim, San Jose, CA (US); Narayanan Ramanan, San Jose, CA (US); Amol R. Joshi, Sunnyvale, CA (US); Krishna Parat, Palo Alto, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 92 days.

This patent is subject to a terminal disclaimer.

(21) Appl. No.: 17/825,960

(22) Filed: May 26, 2022

(65) Prior Publication Data

US 2022/0284968 A1 Sep. 8, 2022

Related U.S. Application Data

(63) Continuation of application No. 16/947,219, filed on Jul. 23, 2020, now Pat. No. 11,355,199.

(51) Int. Cl.
*G11C 16/16* (2006.01)
*G11C 16/04* (2006.01)
(Continued)

(52) U.S. Cl.
CPC .......... *G11C 16/16* (2013.01); *G11C 16/0483* (2013.01); *G11C 16/08* (2013.01); *G11C 16/26* (2013.01); *G11C 16/32* (2013.01)

(58) Field of Classification Search
CPC ..... G11C 16/16; G11C 16/0483; G11C 16/08; G11C 16/26; G11C 16/32; G11C 11/5642; G11C 16/3427; G11C 16/14; H10B 41/41
(Continued)

(56) References Cited

U.S. PATENT DOCUMENTS 10,942,799 B1 * 3/2021 Khakifirooz ........... G11C 16/14
11,127,467 B1 * 9/2021 Wang ..................... G11C 16/08
(Continued)

FOREIGN PATENT DOCUMENTS

CN 101635509 B * 3/2012 ............ H02M 3/156
CN 108231100 A * 6/2018 ............ G11C 7/062
(Continued)

*Primary Examiner* — Michael T Tran
(74) *Attorney, Agent, or Firm* — Alliance IP, LLC

(57) ABSTRACT

An apparatus, a method, and a system. The method includes implementing an erase operation on a deck of a superblock, block or subblock of a three-dimensional (3D) non-volatile memory device to obtain an erased deck; applying a dummy read pulse to one or more wordlines (WLs) of a to-be-read deck of the superblock, block or subblock; and implementing, after application of the dummy read pulse, a read operation on one or more memory cells corresponding to the one or more WLs to read data from the one or more memory cells.

18 Claims, 9 Drawing Sheets

(51) Int. Cl.
 *G11C 16/08* (2006.01)
 *G11C 16/26* (2006.01)
 *G11C 16/32* (2006.01)

(58) Field of Classification Search
 USPC .................................... 365/185.24, 185.29
 See application file for complete search history.

(56) References Cited

U.S. PATENT DOCUMENTS

| | | | | |
|---|---|---|---|---|
| 11,342,035 | B1* | 5/2022 | Pitner | G11C 16/30 |
| 2008/0084764 | A1* | 4/2008 | Pikhay | G11C 17/12 |
| | | | | 365/185.25 |
| 2010/0246265 | A1* | 9/2010 | Moschiano | G11C 11/5635 |
| | | | | 365/185.11 |
| 2011/0305124 | A1* | 12/2011 | Imai | G11B 7/1263 |
| | | | | 369/47.1 |
| 2013/0077399 | A1* | 3/2013 | Kang | G11C 16/349 |
| | | | | 365/185.33 |
| 2015/0332783 | A1* | 11/2015 | Jeong | G11C 16/3459 |
| | | | | 365/185.11 |
| 2016/0217863 | A1* | 7/2016 | An | G11C 16/16 |
| 2017/0140829 | A1* | 5/2017 | Park | G11C 16/20 |
| 2017/0262229 | A1 | 9/2017 | Ochi et al. | |
| 2017/0278574 | A1* | 9/2017 | Park | G11C 16/3418 |
| 2019/0198118 | A1* | 6/2019 | Shim | G11C 16/16 |
| 2019/0221270 | A1* | 7/2019 | An | G11C 16/26 |
| 2019/0244673 | A1* | 8/2019 | Yang | G11C 16/14 |
| 2019/0267103 | A1* | 8/2019 | Jung | G11C 16/26 |
| 2019/0279719 | A1* | 9/2019 | Lee | G11C 16/3472 |
| 2020/0050515 | A1* | 2/2020 | Gim | G11C 16/26 |
| 2020/0159460 | A1* | 5/2020 | Shivanna | G06F 12/0246 |
| 2021/0011633 | A1* | 1/2021 | Kim | G11C 16/0483 |
| 2021/0193225 | A1* | 6/2021 | Park | G06F 11/0754 |
| 2021/0327513 | A1* | 10/2021 | Hwang | G11C 16/32 |
| 2021/0375381 | A1* | 12/2021 | Wu | G11C 29/30 |
| 2021/0397505 | A1* | 12/2021 | Dhotre | G06F 11/0727 |
| 2022/0199185 | A1* | 6/2022 | Yoon | G11C 29/18 |
| 2023/0004297 | A1* | 1/2023 | Wan | G11C 16/34 |
| 2023/0207022 | A1* | 6/2023 | Lu | G11C 16/10 |
| | | | | 365/185.17 |

FOREIGN PATENT DOCUMENTS

| | | | | | |
|---|---|---|---|---|---|
| CN | 109256167 | A | * | 1/2019 | ............. G11C 16/08 |
| CN | 113678204 | B | * | 11/2023 | ......... G11C 16/0483 |

* cited by examiner

METHOD AND APPARATUS TO MITIGATE HOT ELECTRON READ DISTURBS IN 3D NAND DEVICES

CROSS-REFERENCES TO RELATED APPLICATIONS

This application is a continuation (and claims the benefit of priority under 35 U.S.C. § 120) of U.S. patent application Ser. No. 16/947,219, filed Jul. 23, 2020, and entitled "METHOD AND APPARATUS TO MITIGATE HOT ELECTRON READ DISTURBS IN 3D NAND DEVICES", the entirety of which application is incorporated by reference herein.

FIELD

The present disclosure relates in general to the field of computer development, and more specifically, to mitigating read-disturbs in three-dimensional (3D) memory devices, such as in 3D NAND devices.

BACKGROUND

In 3D NAND devices, reading memory cells in one deck of a superblock, block or subblock in the memory device after an erase operation has been performed on another deck in the same superblock, block or subblock results in enhanced hot carrier injection (HCI) read disturb. The above may for example result after erasing individual decks in a block-by-deck architecture of 3D NAND memory devices.

Methods are needed to mitigate HCI read disturbs in 3D NAND memory devices after an erase command given to a deck to be erased.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
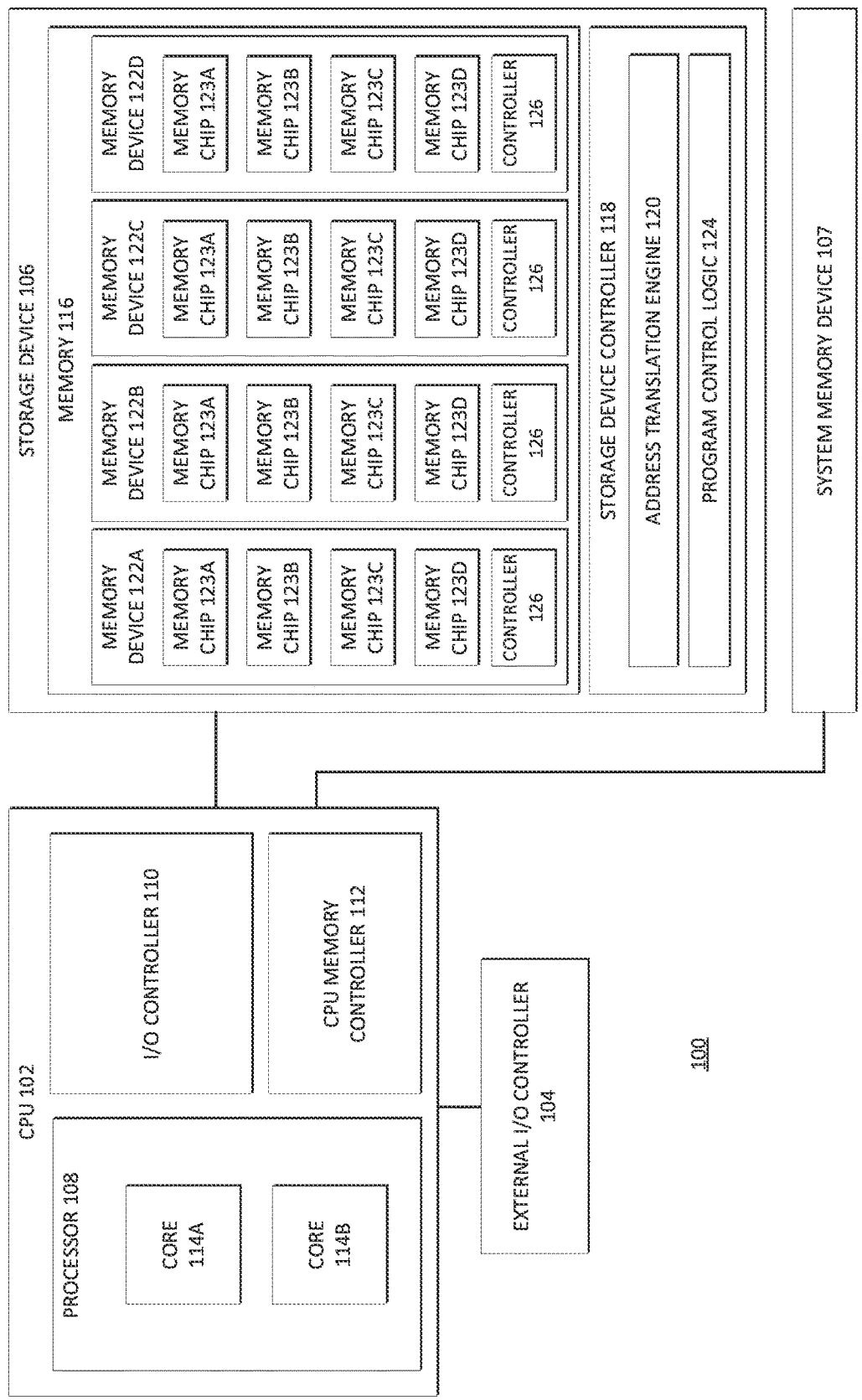
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, storage device 106, and system memory device 107. During operation, data may be transferred between storage device 106 or system memory device 107 and the CPU 102. In various embodiments, particular data operations (e.g., erase, program, and read operations) involving a storage device 106 or system memory device 107 may be managed by an operating system or other software application executed by processor 108.

Some embodiments pertain to a method and apparatus to mitigate WL staircase etch stop layer thickness variations in 3D NAND devices. More details will be set forth regarding embodiments in the context of FIGS. 7A-7E below.

In various embodiments, a storage device 106 comprises NAND flash memory (herein a storage device comprising NAND flash memory is referred to as a NAND flash storage device). In some embodiments, storage device 106 may be a solid-state drive; a memory card; a Universal Serial Bus (USB) flash drive; or memory integrated within a device such as a smartphone, camera, media player, or other computing device. In general, storage devices with NAND flash memory are classified by the number of bits stored by each memory cell. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 106 may include any number of memories 116 and each memory 116 may include any number of memory devices 122 (e.g., 122A-D). In a particular embodiment, a memory device 122 may be or comprise a semiconductor package with one or more memory chips 123 (e.g., memory chips 123A-D). In the embodiment depicted, memory 116 includes memory devices 122A-D (while specific references herein may be made to memory device 122A, the other memory devices may have any suitable characteristics of memory device 122A) and memory device controller 126.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions).

Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and BLs and are individually addressable and in which bit storage is based on a change in bulk resistance. Volatile memory is a storage medium that requires power to maintain the state of data stored by the medium. Examples of volatile memory may include various types of random access memory (RAM), such as dynamic random-access memory (DRAM) or static random-access memory (SRAM). One particular type of DRAM that may be used in a memory array is synchronous dynamic random-access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A memory device 122A includes a plurality of memory cells that are each operable to store one or more bits. The cells of a memory device 122A may be arranged in any suitable fashion, such as in rows (e.g., wordlines or WLs) and columns (e.g., bitlines or BLs), three dimensional structures, and/or other manner. In various embodiments, the cells may be logically grouped into banks, blocks, subblocks, planes, WLs, pages, frames, bytes, or other suitable groups. In various embodiments, a memory device 122A comprises one or more NAND flash memory arrays.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

In a particular embodiment, a memory device 122 is a semiconductor package. In various embodiments, a semiconductor package may comprise a casing comprising one or more semiconductor dies (also referred to as chips) (e.g., memory chips 123A-D). A package may also comprise contact pins or leads used to connect to external circuits. However, a package is merely one example form a memory device 122 may take as a memory device may be any suitable arrangement of one or more memory arrays and associated logic in any suitable physical arrangement. For example, although a single physical package may include a single memory device 122, multiple memory devices 122 could be resident on a single package or a memory 122 could be spread across multiple packages.

A memory 116 may be embodied in one or more different physical mediums, such as a circuit board, die, disk drive, other medium, or any combination thereof (or combination with one or more packages). In a particular embodiment, memory 116 comprises a circuit board coupled to a plurality of memory devices 122 that each comprise a semiconductor package.

Storage device 106 may comprise any suitable type of memory and is not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory devices(s) and/or memory chip(s) thereof), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located, one or more pages of the physical memory location, one or more subblocks of the physical memory location, one or more WLs of the physical memory location, one or more BLs of the physical memory location, or other suitable identifiers or encodings thereof.

In the storage device 106 also includes program control logic 124 which alone or in combination with a memory device controller 126 is operable to control the programming sequence performed when data is written to a memory 116, the read sequence performed when data is read from a memory 116, or an erase sequence when data is erased from a memory 116. In various embodiments, program control logic 124 may be included in memory circuitry, and may provide the various voltages (or information indicating which voltages should be provided) that are applied to one or more memory cells, WLs, BLs, and/or other portions of a memory array during the programming, reading, and/or erasing of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all, or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
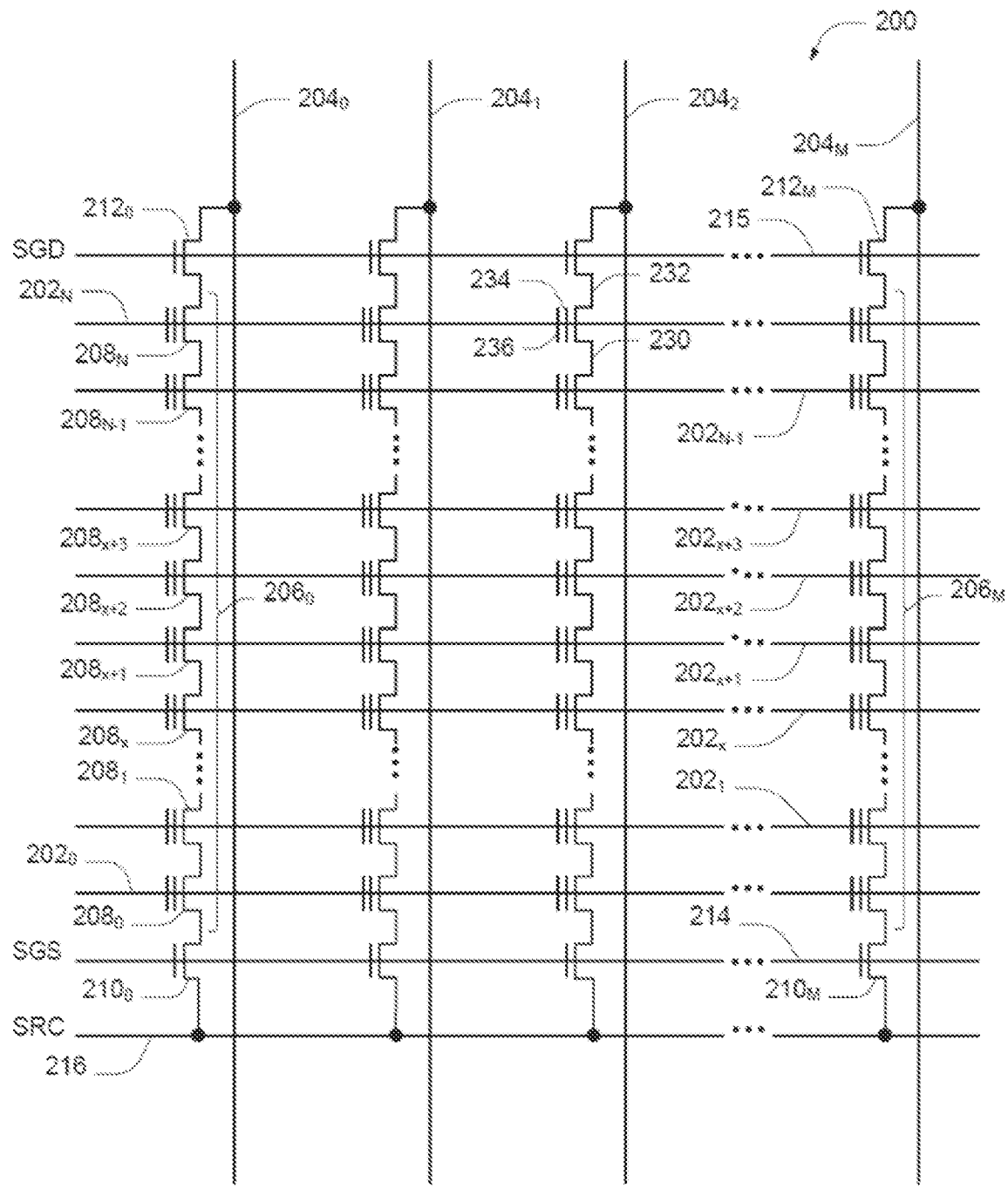
FIG. 2 illustrates an example portion of a NAND flash memory array in accordance with certain embodiments.

FIG. 2 illustrates an example portion of a NAND flash memory array 200 in accordance with certain embodiments. In various embodiments, memory device 122A includes an array 200 of memory cells logically arranged in rows and columns. Memory cells of a logical row are typically connected to the same access line (commonly referred to as a WL) while memory cells of a logical column are typically selectively connected to the same data line (commonly referred to as a BL). In some embodiments, a single access line may be associated with more than one logical row of memory cells and a single data line may be associated with more than one logical column. Memory cells of the array are capable of being programmed to one of at least two data states (i.e., program levels).

Memory array 200 includes access lines, such as WLs $202_0$ to $202_N$, and data lines, such as BLs $204_0$ to $204_M$. In some embodiments, the WLs 202 may be connected to global access lines (e.g., global WLs) in a many-to-one relationship.

Memory array 200 may be arranged in rows (each corresponding to a WL 202) and columns (each corresponding to a BL 204). Each column may include a string of series-connected memory cells, such as one of NAND strings $206_0$ to $206_M$. Each NAND string 206 may be connected (e.g., selectively connected) to a common source 216 and may include a plurality of memory cells. For example, NAND string $206_0$ includes memory cells $208_0$ to $208_N$. The memory cells 208 represent non-volatile memory cells for storage of data. The memory cells 208 of each NAND string 206 may be connected in series between a select transistor 210 (e.g., a field-effect transistor), such as one of the select transistors $210_0$ to $210_M$ (e.g., that may each be a source select transistor), and a select transistor 212 (e.g., a field-effect transistor), such as one of the select transistors $212_0$ to $212_M$ (e.g., that may each be a drain select transistor). Select transistors $210_0$ to $210_M$ may be commonly connected to a select line 214 or select gate source (SGS), such as a source select line, and select transistors $212_0$ to $212_M$ may be commonly connected to a select line 215 or select gate drain (SGD), such as a drain select line. In a particular embodiment, a SGD may be coupled to the drain select transistors of an entire subblock (and each subblock may have its own drain select line) while a SGS may be coupled to the source select transistors of an entire block (and each block may have its own source select line).

A source of each select transistor 210 may be connected to common source line (SRC) 216. The drain of each select transistor 210 may be connected to a memory cell $208_0$ of the corresponding NAND string 206. For example, the drain of select transistor $210_0$ may be connected to memory cell $208_0$ of the corresponding NAND string $206_0$. Therefore, each select transistor 210 may be configured to selectively couple a corresponding NAND string 206 to common source 216. A control gate of each select transistor 210 may be connected to select line 214.

The drain of each select transistor 212 may be connected to the BL 204 for the corresponding NAND string 206. For example, the drain of select transistor $212_0$ may be connected to the BL $204_0$ for the corresponding NAND string $206_0$. The source of each select transistor 212 may be connected to a memory cell of the corresponding NAND string 206. For example, the source of select transistor $212_0$ may be connected to memory cell $208_N$ of the corresponding NAND string $206_0$. Therefore, each select transistor 212 may be configured to selectively connect a corresponding NAND string 206 to a corresponding BL 204. A control gate of each select transistor 212 may be connected to select line SGD 215.

The memory array in FIG. 2 may be a quasi-two-dimensional memory array and may have a generally planar structure, e.g., where the common source 216, NAND strings 206 and BLs 204 extend in substantially parallel planes. Alternatively, the memory array in FIG. 2 may be a three-dimensional memory array, e.g., where NAND strings 206 may extend substantially perpendicular to a plane containing the common source SRC 216 and to a plane containing the BLs 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a WL 202.

A column of the memory cells 208 is one or more NAND strings 206 selectively connected to a given BL 204. A row of the memory cells 208 are memory cells commonly connected to a given WL 202. A row of memory cells 208 may, but need not include all memory cells 208 commonly connected to a given WL 202. Rows of memory cells 208 may often be divided into one or more groups of physical pages of memory cells 208, and physical pages of memory cells 208 often include every other memory cell 208 commonly connected to a given WL 202. For example, memory cells 208 commonly connected to WL $202_N$ and selectively connected to even BLs 204 (e.g., BLs $204_0$, $204_2$, $204_4$, etc.) may be one physical page of memory cells 208 (e.g., even memory cells) while memory cells 208 commonly connected to WL $202_N$ and selectively connected to odd BLs 204 (e.g., BLs $204_1$, $204_3$, $204_5$, etc.) may be another physical page of memory cells 208 (e.g., odd memory cells). Although BLs $204_3$-$204_5$ are not expressly depicted in FIG. 2, it is apparent from the figure that the BLs 204 of the array of memory cells 200 may be numbered consecutively from BL $204_0$ to BL $204_M$. Other groupings of memory cells 208 commonly connected to a given WL 202 may also define a physical page of memory cells 208. For certain memory devices, all memory cells commonly connected to a given WL may be deemed a physical page. For particular memory devices, all memory cells of a particular subblock commonly connected to a given WL may be deemed a physical page. For example, memory cells that are coupled to a particular WL in a subblock may comprise a first physical page, memory cells that are coupled to the particular WL in a second subblock may comprise a second physical page, and so on. A bit from each memory cell of a physical page may be deemed a logical page. Thus, a single physical page may store multiple logical pages (e.g., a TLC scheme may store three logical pages in a single physical page).

In sensing (e.g., reading) a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) may be applied to the control gate of memory cell $208_{x+1}$ while voltage levels are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. A sense operation that determines whether the memory cell $208_{x+1}$ is activated in response to one or sense voltages may indicate one or more bits of the data state stored in that memory cell. In various embodiments, each memory cell 208 can be programmed according to an SLC, MLC, TLC, a QLC, or other encoding scheme. Each cell's threshold voltage (Vt) is indicative of the data that is stored in the cell.

Although various embodiments have been described with respect to a particular type of memory array (e.g., a NAND flash memory array), the teachings of the various embodiments may be equally applicable to any type of memory arrays (e.g., AND arrays, NOR arrays, etc.), including those recited herein or similar memory arrays.

Figure 3:
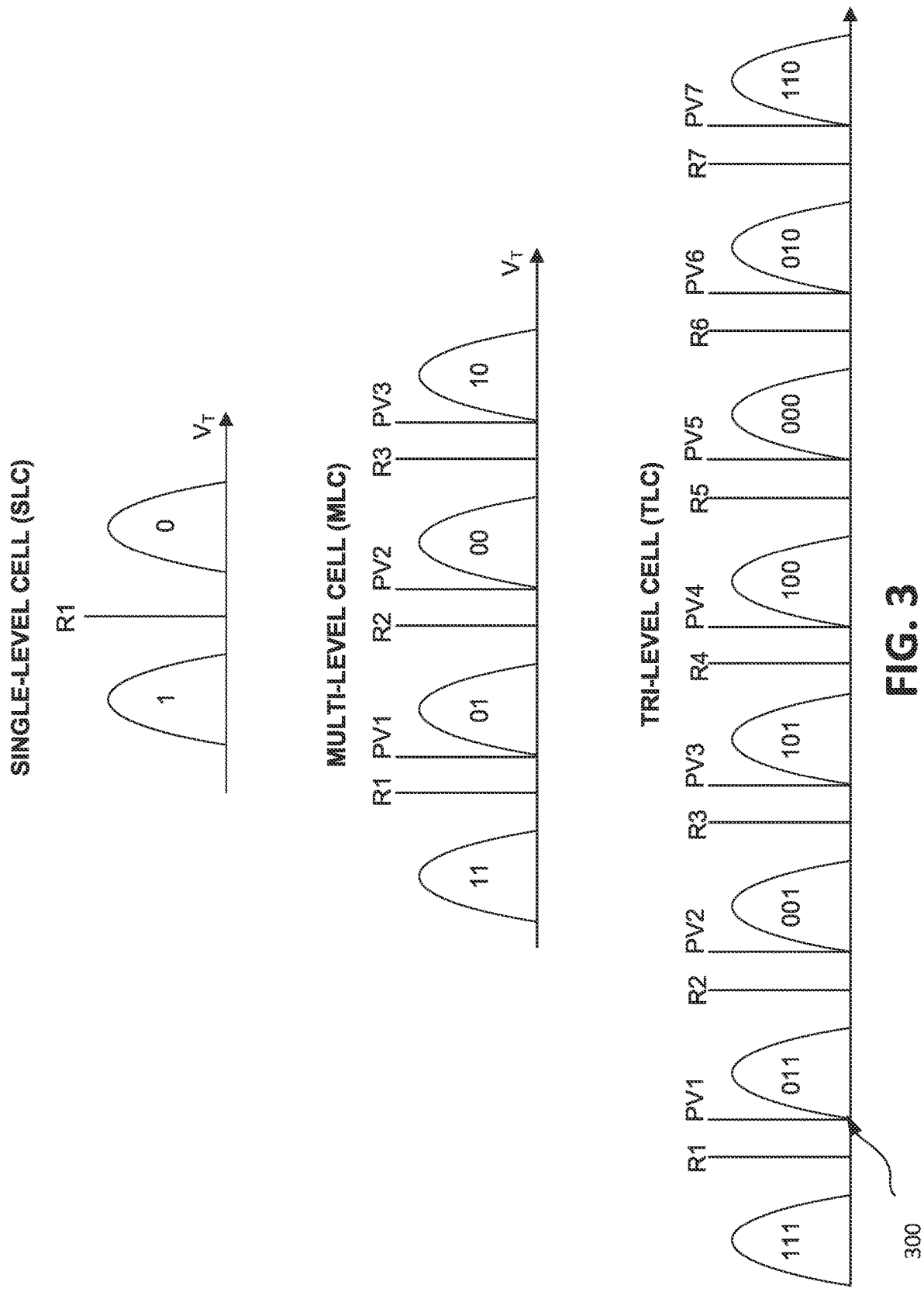
FIG. 3 illustrates example encodings of bits within NAND flash memory cells in accordance with certain embodiments.

FIG. 3 illustrates example encodings of bits within NAND flash memory cells 208 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted elliptical regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a WL when the values of cells coupled to that WL are being read. When a particular read voltage is applied, sense circuitry may determine whether the threshold value of a cell is greater than or less than the read voltage based on a voltage or current sensed by the sense circuitry via the BL of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during programming of the cell (e.g., during a program verify operation) to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droppage over time and to improve sensing accuracy. For example, the figure depicts a margin between R1 and PV1, a margin between R2 and PV2, and so on.

In particular embodiments, cells may be programmed one or more pages (e.g., logical pages) at a time, where a page is stored in a group of cells (e.g., a physical page) that are coupled to the same WL. For example, the group of cells that is programmed may be identified by a particular WL and a particular subblock. The group of cells may store one page of data (if the cells are encoded according to an SLC scheme) or multiple pages of data (if the cells are encoded according to an MLC, TLC, QLC, or other multi-level encoding scheme).

Figure 4:
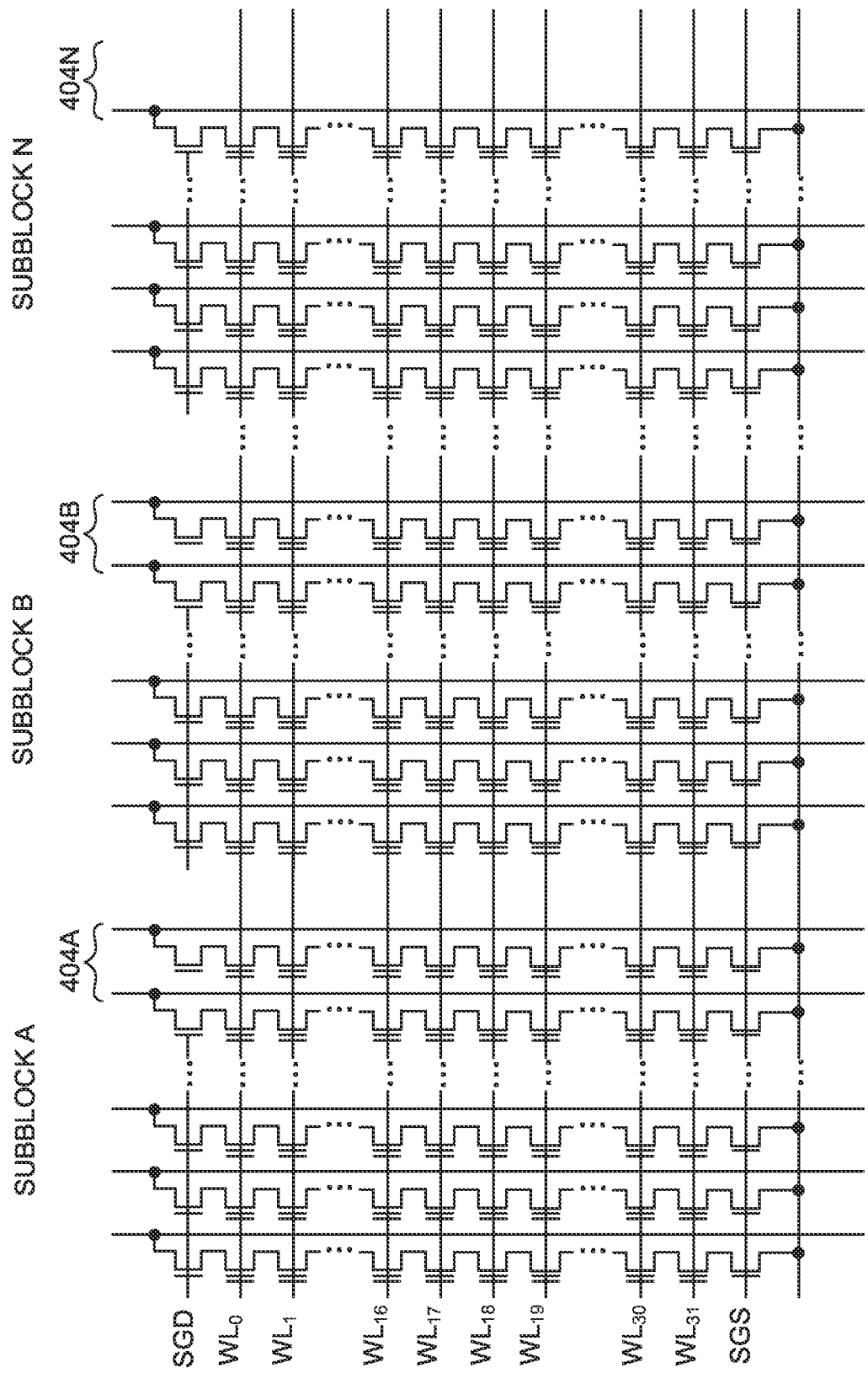
FIG. 4 illustrates example subblocks of a block of a memory device in accordance with certain embodiments.

FIG. 4 depicts memory cells of a memory array arranged into a plurality of subblocks (subblocks 404A-404N) in accordance with certain embodiments. In a particular embodiment, memory cells of an array 200 of chip 123 may be arranged into subblocks and blocks. As an example, a subblock may comprise a number of series strings and a block may comprise a number of subblocks. In various embodiments, a source select line (controlled by source gate select signal SGS) is shared by each series string of a block and each series string of a particular subblock shares a drain select line (controlled by drain gate select signal SGD) with each subblock having its own drain select line.

In a particular embodiment, a subblock may contain a single physical page of memory for each WL of the subblock (in other embodiments, a subblock may contain multiple physical pages of memory for each WL). Thus, a block of memory may be divided into a large number of physical pages. As described above, a logical page may be a unit of programming or reading that contains a number of bits equal to the number of cells in a physical page. In a memory that stores one bit per cell (e.g., an SLC memory), one physical page stores one logical page of data. In a memory that stores two bits per cell (e.g., an MLC memory), a physical page stores two logical pages.

Figure 5:
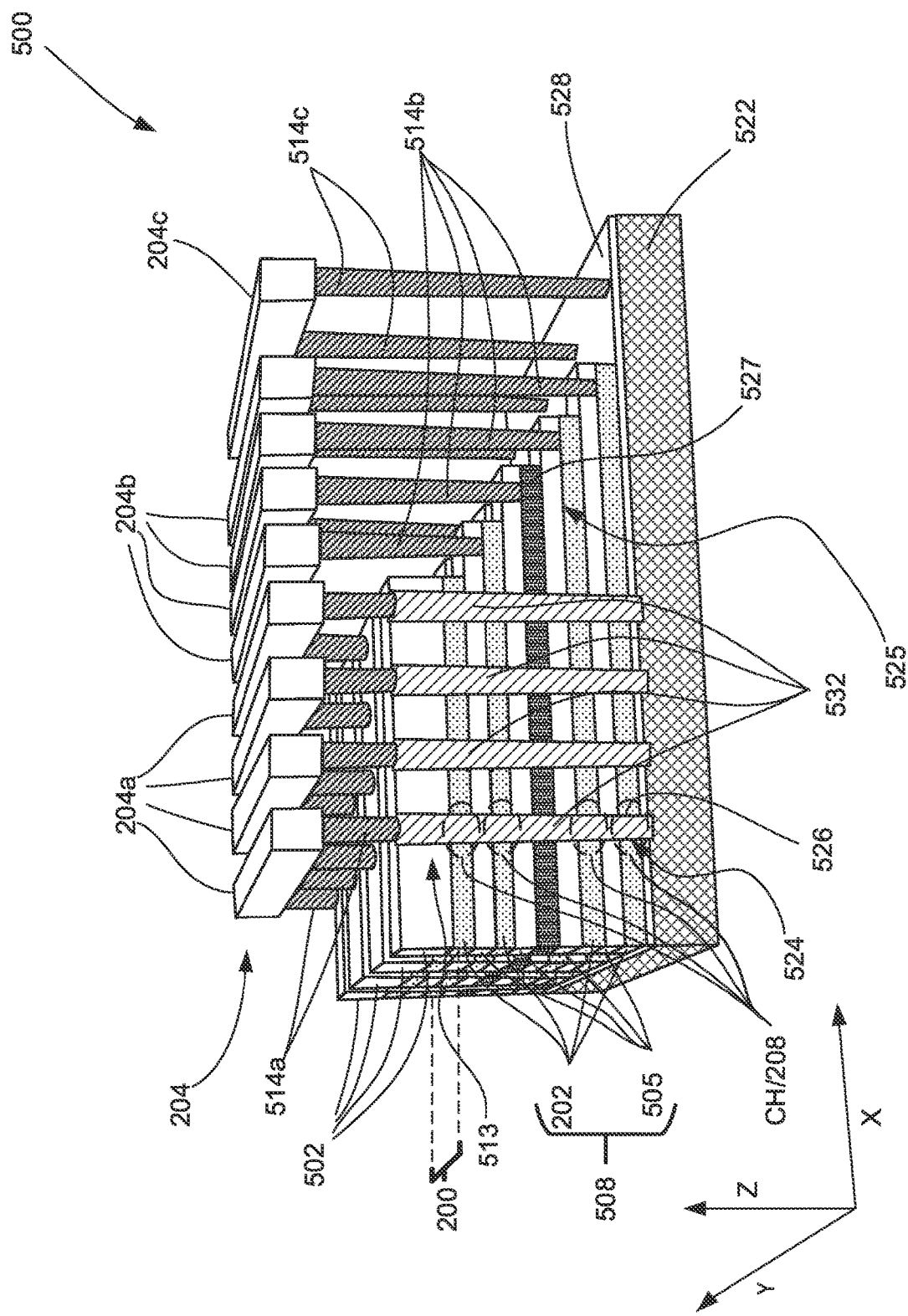
FIG. 5 illustrates a schematic, perspective view of a tile of a 3D NAND device according to one embodiment.

FIG. 5 illustrates an example perspective view diagram of a tile 500 of 3D NAND flash memory arrays, such as a stack of arrays similar to array 200 of FIG. 2. A tile of memory blocks includes several memory blocks, e.g., 200 blocks, where each block is comprised of a stack (e.g., a 32 tier stack) of memory cell pages. Each memory cell block 502 includes a WL stack, each stack including a plurality of WLs 202 and a plurality of interlayer dielectrics/interlayer dielectric layers 505. The WLs 202 are interposed between the interlayer dielectrics 505 (collectively, a WL stack 508) in an alternating manner, according to one embodiment. The WLs 202 are a simplified representations of a number of WLs (e.g., 32 WLs or more) that may be included in a NAND 3D memory array, such as a NAND 3D memory array corresponding to FIG. 2. At least some of WLs 202 may correspond to WLs 202 of FIG. 2. The WLs 202 are conductive layers such as silicon layers or polysilicon layers, according to one embodiment. The interlayer dielectrics 505 are simplified representation of a number of dielectric layers that may be used to separate the WLs 202, according to one embodiment. The interlayer dielectrics 505 may include oxide layers, according to one embodiment. Referring still to FIG. 5, tile 500 further includes bitlines 204a and contact lines 204b and 204c extending substantially perpendicularly to the WLs 202 or blocks 502 in the shown embodiment.

Tile 500 of FIG. 5 is supported by a substrate structure 522 with an insulating layer (now shown) that encompasses the shown tile 500. The insulating layer may be formed of an insulating material, such as a bonding dielectric layer, having a predetermined thickness, and including, for example, at least one of, for example, SiO, SiN, SiCN, SiOC, SiON, and SiOCN.

Tile 500 is situated on a substrate structure or substrate 522, such as a silicon substrate, which includes control circuitry therein (not shown), such as control circuitry including transistors, row decoders, page buffers, etc. Pillars 513 are disposed to penetrate the stacks and to define channels CH. First contact structures 514a connect BLs 204a to respective channels CH and thus couple the BLs 204a to corresponding memory cells 208 defined by the channels CH. Memory cells 208 may correspond to memory cells 208 of FIG. 2. BLs 204a may correspond to BLs 204 of FIG. 2. Second contact structures 514b are configured to apply a signal to the WLs 202, and are connected to contact lines 204b as shown. Third contact structures 514c are configured to connect contact lines (one of which is shown) 204c directly to control circuitry within the substrate structure 522. The control circuitry of substrate structure 522 may include, for example, circuitry of a controller, such as controller 126 of FIG. 1, circuitry of a storage device controller, such as storage device controller 118 of FIG. 1 including program control logic 124. Each row of WLs 202 across multiple blocks 202 extending in the Y direction and including the corresponding channel sections as coupled to corresponding BLs would define a memory array 200, and may correspond to a memory array such as memory array 200 of FIG. 2. As shown in FIG. 5, a plug 527 may be provided between stacks of WLs to define decks of the memory device on each side of the plug. It is to be noted that the memory device of FIG. 5 is merely a schematic depiction, and that a device implementation may include a number of plugs to define multiple decks in a memory device.

The WLs 202 may be disposed to form a staircase 525, shown in FIG. 5, in the X direction and to form a staircase (not shown) in the Y direction. A predetermined region, including end portions of the WLs 202, may be exposed by the steps. In the regions, the WLs 202 may be connected to first contact structures 514a. The WLs 202 may be disposed to be separated in predetermined units by separation regions in the Y direction. The WLs 202 may constitute a single memory block between a pair of the separation regions, but the scope of the memory block is not limited thereto.

The interlayer dielectrics 505 may be disposed between the WLs 202. Similarly to the WLs 202, the interlayer dielectrics 505 may be spaced apart from each other in both the Y direction and the Z direction. The interlayer dielectrics 505 may include an insulating material, such as a silicon oxide or a silicon nitride. The channels CH may be spaced apart from each other, while forming rows in the Y direction and columns in the Z direction. In example embodiments, the channels CH may be disposed to form a lattice pattern or may be disposed in a zigzag manner in one direction. Each of the channels CH may have a pillar shape and be part of a pillar 532 of multiple similar pillars extending through the blocks 502, and may have an inclined side surface which becomes narrower as it comes close to the substrate structure 522. Other shapes for the pillars and channels are possible for embodiments.

A channel region 524 may define each of the channels CH, and corresponds to a memory cell of a memory array 200, such as cells 208 of FIG. 2. In each of the channels CH, the channel region 524 may be formed to have an annular shape. However, in other example embodiments, the channel region 524 may be formed to have a circular shape or a prismatic shape. The pillars 532 may be connected to an epitaxial layer 528 above substrate structure 522. The pillars may include a semiconductor material, such as polycrystalline silicon or monocrystalline silicon. The semiconductor material may be an undoped material or a material containing p-type or n-type impurities.

A gate dielectric layer 526 may be disposed between the WLs 202 and the channel region 524. Although not illustrated in detail, the gate dielectric layer 526 may include a tunneling layer, a charge storage layer, and a blocking layer which are sequentially stacked from the channel region 524. The tunneling layer may be configured to tunnel charges to the charge storage layer and may include, for example, silicon oxide ($SiO_2$), silicon nitride ($Si_3N_4$), silicon oxynitride (SiON), or combinations thereof. The charge storage layer may be a charge trapping layer or a floating gate conductive layer. The blocking layer may include silicon oxide ($SiO_2$), silicon nitride ($Si_3N_4$), oxynitride (SiON), a high-k dielectric material, or combinations thereof.

First, second and third contact structures 514a, 514b and 514c, BLs 204a, and contact lines 204b and 204c, which are interconnection structures for forming an electrical connection to the substrate structure 522, may include a conductive material. The interconnection structures may include, for example, tungsten (W), aluminum (Al), copper (Cu), tungsten nitride (WN), tantalum nitride (TaN), titanium nitride (TiN), or combinations thereof. Each of the contact structures may have a cylindrical shape. In example embodiments, each of the first and second contact structures may have a inclined side surface which becomes narrower as it comes close to the substrate structure 522.

Figure 6:
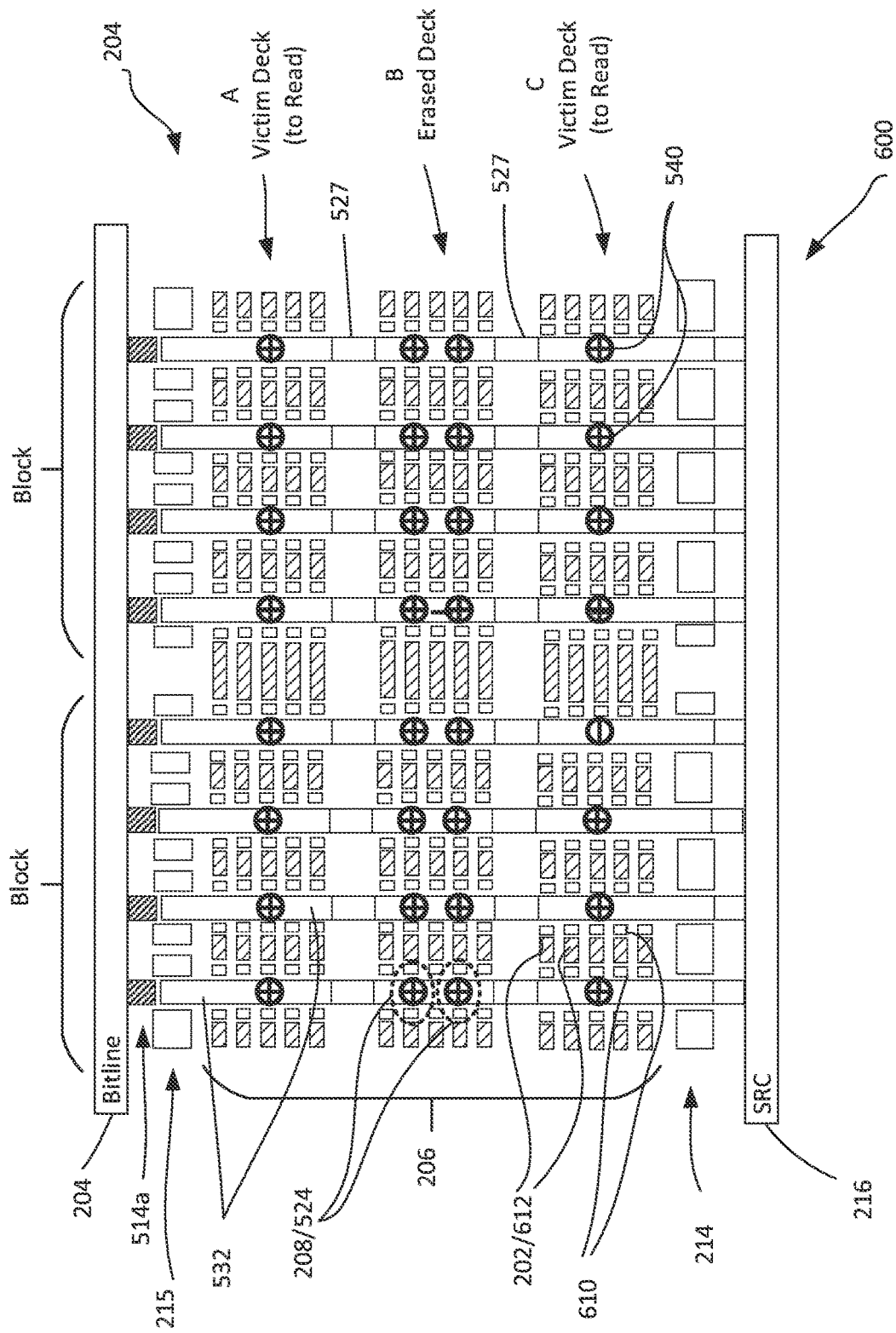
FIG. 6 is a cross sectional view of a portion of the tile of FIG. 5.

Reference is now made to FIG. 6, which shows a cross section 600 through a portion of a 3D NAND flash memory array tile, similar to tile 500 of FIG. 5, and which further shows an array of memory cells similar to the array 200 of FIG. 2. Accordingly, like components as between FIGS. 2, 5 and 6 will be referred to with like reference numerals, it being understood that there may be differences in some details as between the architecture shown in each respective figure. Referring to FIG. 5, the cross section 600 is taken in a plane parallel to a length of one of the BLs 204a in the Y direction, and cutting through WL stacks 508 of a number of blocks/subblocks 502 and a number of pillars 532. To the extent that BL 204a is used to apply bias to any of the channel regions 524 or associated memory cells 208 along a given pillar 532, the length direction of a pillar 532 may be considered to correspond to a length direction of a given "effective" BL expending through the WL stack 208 of a block 502. The effective BLs correspond to BLs $204_0$ to $204_M$ of FIG. 2, which are shown as intersecting WLs $208_0$ to $208_N$ to form respective NAND strings 206.

Cross section 600 further shows SGS 214, SGD 215, and SRC 216 similar to the same components shown in FIG. 2. Channels regions 524 on each pillar 532 correspond to memory cells 208 as noted above, and plugs 527 define a deck 520 on each side thereof. Although only two blocks (or these could also be deemed to constitute subblocks) 502 are partially shown in FIG. 6 with three decks and four pillars per block, embodiments are not so limited, and include within their scope any number of decks, plugs, pillars, blocks, subblocks, superblocks, WLs, and BLs.

Referring still to FIG. 6, each channel region 524/memory cell 208 includes a floating gate 610 disposed annularly around each pillar, a control gate 612 which corresponds to an associated WL 202 adjacent the floating gate of each memory cell 208. The WL 202 and floating gate 610 may be made of a polysilicon material, and the space between floating gate 610 and control gate 612/WL 202 may be filled with a dielectric material, such as an interpoly dielectric, which may correspond to the gate dielectric material 526 of FIG. 5. The channel (not shown) is defined between the floating gate 610 and an inner, filler region of each pillar at the region of each memory cell 208. A tunnel oxide (not shown) may be disposed between the floating gate and the channel.

Embodiments include the application of a dummy read pulse to one or more WLs of a memory device after an erase operation and before a read operation. A dummy read pulse as referred to herein may include a constant bias applied indiscriminately on all the WLs of an entire superblock, and may, by way of example, include a pulse similar to a read pulse, but that is not followed by a return of read data. The one or more WLs may include all WLs of a superblock (a logical and/or physical group of blocks), block or subblock of memory cells, with the superblock, block or subblock defined by way of groups of cells (for a subblock), of subblocks (for a block) and blocks (for a superblock) that may be grouped together logically and/or physically, as suggested by way of example in the context of FIG. 4. The one or more WLs may include all WLs of a superblock, block or subblock, or they may include select WLs of the superblock, block or subblock. The select WLs may be selected based on WLs corresponding to cells that are to be the subject of the read operation, WLs based on other parameters such as expected performance parameters based on the read operation to be taking place.

In 3D NAND architectures, such as those shown by way of example in FIGS. 2 and 4-6, the intrinsic or lightly doped channel has no conventional body contact to supply and/or evacuate holes, as compared with channels in a 2D NAND counterpart architecture. To implement an erase operation that requires the involvement of holes in such 3D architectures, gate induced drain leakage (GIDL) has been introduced at selected gates at the source and drain regions of a given deck. On the other hand, to reduce the logical block size of the memory device, and in order to save die area and improve system performance, each physical block of 3D NAND is divided into several independently controllable decks. When one of the decks is erased, a number of holes in the form of positive potential is introduced into the channel of other decks that share the pillar with the erased deck, as schematically illustrated in FIG. 6, and as noted above by way of holes 540. Hot electron read disturb issues may arise when one or more decks of a superblock/block/subblock are erased, and when memory cells of other, to-be-read decks of that superblock/block/subblock are to be read, which memory cells share a pillar with the memory cells of the erased deck(s).

The holes left behind from an erase operation raise the potential in the pillars. When memory cells of a to-be-read deck that share pillars with an erased deck, the holes trapped in the pillars from the erase operation result in a large enough difference in potential between an aggressor cell (a memory cell being read, the aggressor cell being in the to-be-read deck or "victim deck") and a victim cell (a memory cell not being read, the victim cell being in the victim deck as well) to result in a HCI read disturb to the victim cell.

Let us now refer again specifically to FIG. 6. In a conventional erase and read operation, if the middle deck B is to have its memory cells 208 erased, an erase pulse is applied by keeping the WLs of the erase deck B near ground, and biasing the pillars to a very high positive voltage through the BL 204 and SGS 214 (and effectively to each cell's drain and source along the NAND strings of the superblock). This generates a high enough voltage between the grounded WLs of erase deck B, which make up the control gate of the cells in erase deck B, and the BL 204 and SGS 214, which are connected respectively to each channel's drain and source, to force a current to flow from the channel within the pillar to which the very high positive voltage is applied, through the floating gate 610, to the control gate 612/WL 202. The holes generate a voltage differential between the pillar and the floating gates, which leads to the erasing of select cells, by virtue of a movement of charge out of the channel through the control gates/WLs. However, the WLs of the upper deck A and lower deck C are not grounded (so as to not erase the memory cells within those decks). As a result, a high voltage differential/potential may exist between the channels of the memory cells to be read in upper deck A and lower deck C on the one hand, and the WLs on the other hand, without erasing the cells to be read. This voltage differential may result in the voltage of the corresponding floating gates of the memory cells to be read to float up as well, in some cases for example up to 16 V.

The erase operation described above requires that the upper deck A and the lower deck C be conductive to holes (positive charges) supplied from BL 204 and SGS 214 in order to allow the erase operation on erase deck B. The above is necessitated by the physical configuration of the memory device, where drain and source voltages are shared as between decks by virtue of the configuration of the pillars through the WLs. The above however results, after an erase, in the generation of holes in the channels within pillars 532 not only in the erase deck C, but also in upper deck A and lower deck B, which still include charge corresponding to stored data.

If a read operation is performed on cells on either upper deck A or lower deck C, the existence of the holes in channels within pillars 532 can result in a read disturb for the cells that are to be read typically by virtue of hot electron injection. For this reason, upper deck A and lower deck C are referred to in FIG. 6 as victim decks. The existence of holes can increase the electric field between adjacent cells during read which results in enhanced HCI read disturb.

The large number of holes trapped in the pillars after an erase pulse may be exacerbated by virtue of the randomly distributed low threshold voltage (Vt) and high-Vt cells in the pillars, as well as by the band-to-band tunneling (BTBT) nature of GIDL at SGS 215 and SGD 214. The remaining holes can create a risky stable-state read disturb (SRD) condition for the subsequent read operation to begin with.

Figure 7:
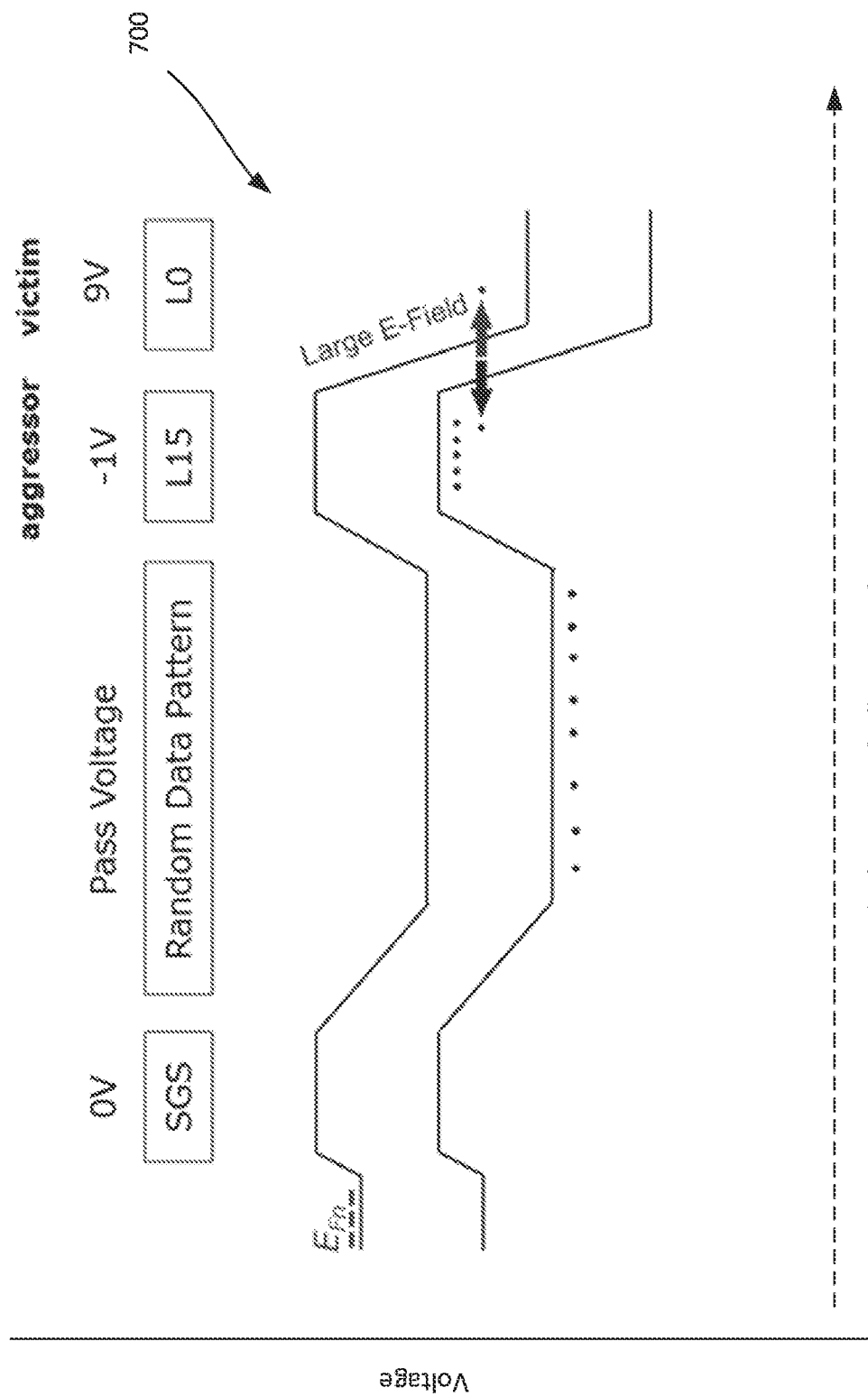
FIG. 7 is a graph showing conductance bands along a pillar in the tile of FIG. 6.

FIG. 7 shows graphs 700 which schematically illustrates the mechanism of SRD as augmented by an erase operation. Graphs 700 depicts valance bands along a pillar 527 in a victim deck, such as victim deck C of FIG. 6, from SGS 214, through a number of memory cells 208 having a random data pattern with the pillar at a pass voltage through a number of WLs, and through an aggressor cell with the pillar at −1V to effect a read operation, and further through a neighboring victim cell with a positive pillar voltage at 9V. The holes in the pillar at the region of the victim cell may exist even without an erase operation, but may be exacerbated by an erase operation, as described above. As can be seen in FIG. 7, a large electric field can result between an aggressor cell and its neighboring victim cells by virtue of the relatively large voltage differential, resulting in a hot electron disturb.

If a 3D NAND memory device is in a stable state, the pillars are in equilibrium with source and BL, and local WLs are in equilibrium with the global WL. In such a case, the channel of low-Vt cells will be boosted to a higher potential before their neighbor high-Vt cells are fully turned on. Once a ramping up WL bias eventually turns on those high-Vt cells, the WL is capacitively coupled down to the pillar potential which slows the WL ramp up during a turning on of the high-Vt cells. A slow ramp up of the WL voltage makes the highest-Vt cells in the aggressor WL (the WL of the memory cell to be read) difficult to fully turn on, leaving its neighbor cells (normally at the side further from the source/bitline) always in boosted condition, and being boosted to very high positive potential. When the bias of aggressor WL ramps down to read the lowest Vt, the channel potential of the highest-Vt cells in the aggressor WL ramps up, forming a large potential difference with the neighbor low-Vt victim cells. As schematically shown in FIG. 7, the large electric field at the junction of an aggressor memory cell and a victim memory cell can trigger the hot electron disturb to the victim cell and hot hole disturb to the aggressor cell. This mechanism is exacerbated when holes attributable to an erase operation are additionally injected into the pillars of a superblock/block/subblock where memory cells are to be read.

An erase pulse is to remove all trapped transient electrons, augmenting however a SRD environment in the pillars that run through an erased deck. The SRD can exist even without being preceded by an erase operation at least by virtue of the large positive potential and excess holes in the pillars to be brought back to equilibrium in the source line SGS and BL, and removed during a normal read operation. The above, when exacerbated by a preceding erase operation, can lead to an even slower WL voltage ramp up and higher SRD risk as compared with a standard SRD.

Embodiments involve the removal of holes within channels of memory cells to be read whose channels include holes therein by virtue of an erase operation on other cells within the same memory device, the removal by applying a dummy read pulse (or "ARR pulse") to the WLs of those memory cells in order to remove the holes from the channels of those cells to be read. The above may in turn bring the pillar potential back to equilibrium with source (SRC) and BL (BL) before the formal read operation of memory cells to be read. The dummy read pulse may be applied to one, a plurality and/or all WLs within a deck including one or more memory cells to be read. The dummy read pulse may for example include a square pulse. The memory cells to be read may be disposed in one or more decks disposed with respect to an erased deck of a memory superblock, block or subblock such that the holes would have caused a hot electron disturb in the cells to be read if the dummy read pulse was not applied. The dummy read pulse may be a negative voltage pulse applied to WLs of the memory cells to be read in order to supply electrons to the channels of the memory cells to be read to remove holes from their channels before a read operation. The dummy read pulse may be applied to WLs in a deck, such as to all WLs in upper deck A or lower deck C that have memory cells to be read, after an erase operation on erase deck C. The dummy read pulse may be applied in the form of a negative voltage on one or more WLs and controlled by existing control circuitry, such as control circuitry of controller 126 of each memory device 122 of FIG. 1, or such as any other control circuitry, including that of storage device controller 118, CPU memory controller 112 or circuitry of processor 108 all in FIG. 1. The control circuitry may be used to control the voltage on each WL separately after the erase. The functionality of implementing application of a dummy read operation may be provided by virtue of logic, such as software or firmware, that is stored within controllers 126 or 118 of FIG. 1 by way of example The dummy read pulse may be applied immediately after an erase operation, or it may be applied immediately before a read operation. The dummy read pulse may be applied selectively to the WLs of memory cells to be read, it may be applied selectively to all WLs of decks, which WLs include one or more memory cells to be read (hereinafter "to-be-read" memory cells), and/or to all WLs of a superblock, block or subblock of a memory device. The dummy read pulse may further be applied selectively to WLs based on timing and/or performance metrics of the memory device in which the dummy read pulse is to be implemented.

According to some embodiments, the ARR pulse may be applied on victim decks only, and not on the erased deck, the ARR pulse may be applied on decks which contain data and any additional decks providing a path to the source or drain, and/or applied after every erase pulse, applied every several erase-read cycles. According to some embodiments, an erase-suspend command may be given to a memory cell to be ready prior to the ARR pulse being applied to the WL thereof.

Figure 8:
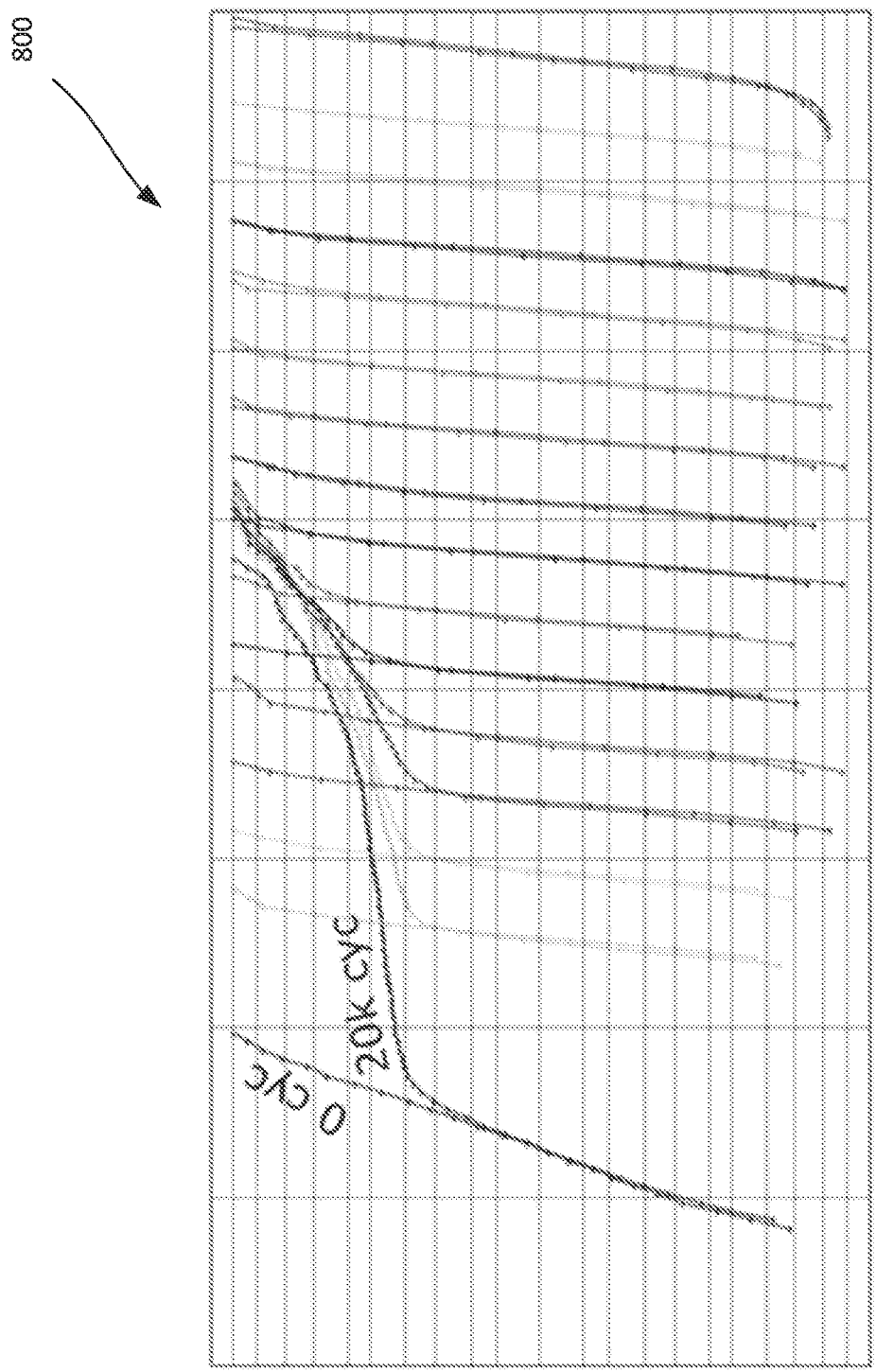
FIG. 8 is a graph of threshold voltage Vt distribution plots along a WL in the tile of FIG. 6 for 0 cycle and 20 K cycles of an erase/read operation based on experimental data.

Referring next to FIG. 8, a graph 800 obtained by way of experimental data includes a number of cycling plots for threshold voltage distributions of memory cells of a given memory page or WL (in this case WL 47 of lower deck C), with a cluster of low-Vt memory cells having Vts between about −1000V to about 1250V for data corresponding to 0 cycle for the cells and a cell distribution at the 99.99% level, and a cluster of high-Vt memory cells having Vts for data corresponding to 9 cycle and for the cell distribution at the 99.99% level above about 1250V. Graph 800 essentially shows programming levels of a large number of memory cells on a page as plotted against the % of cells that are within given ranges of those programming levels. Zero cycle corresponds to no or zero erase cycle/zero read cycle, and 20 k cycles corresponds to 20,000 erase cycles for a deck other than a deck within the same superblock/block/subblock including the memory cells reflected in graph 800, and a corresponding 20,000 read cycles for the memory cells reflected in graph 800. As can be seen from graph 800, many erase cycles can bring about a dramatic shift in programming voltages of memory cells for the lower Vt cells, and this by virtue of hot electron effects. After cycling, as shown, the Vt distribution will be degraded for the lower Vt cells because of different types of disturb, one of which is the hot electron disturb effected explained above. In an ideal case, we would wish for a near vertical set of plots at each Vt level, although the actual Vt distribution will show a gradient line. The margin or distance between the different gradient lines represents a read sense margin, which ideally ought to be large enough to allow a differentiation as between programming states of memory cells. It is easy to see from FIG. 8 that the hot electron effects can dramatically skew the programming voltages of lower Vt cells, making a read as between the different states of those cells nearly impossible.

Thus, per FIG. 8, as shown by the extensive experimental data therein, erase augmented SRD is primarily reflected in hot electron disturb to the low Vt cells in the victim WL, as shown for example for 20,000 erase operations on middle deck B and reads on WL 47 in lower deck C, leading to a collapse of the lowest seven Vt distributions of victim cells.

Figure 9:
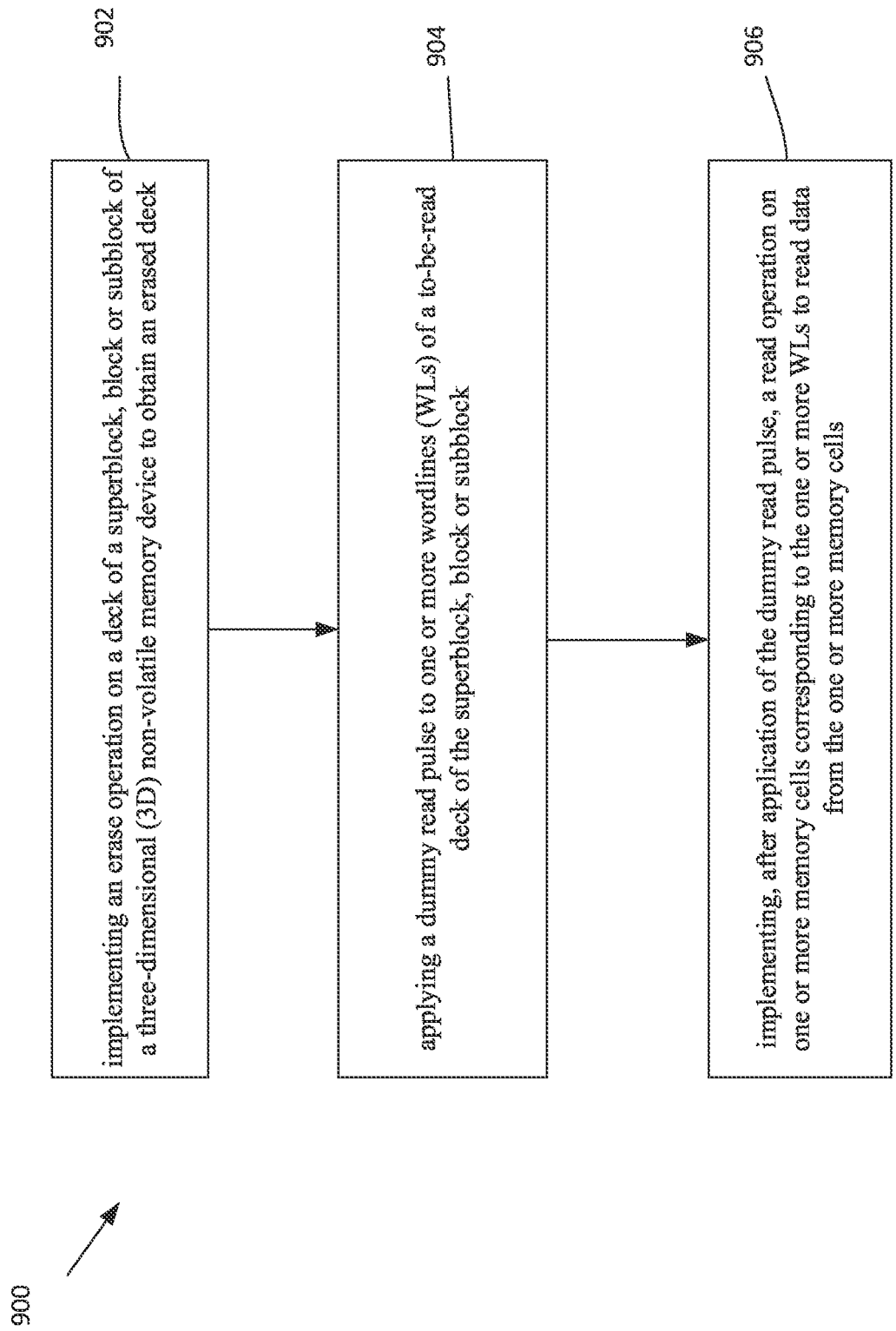
FIG. 9 is a flow diagram of a process according to some embodiments.

FIG. 9 shows a flow or method 900 according to an embodiment. At operation 902, the method includes implementing an erase operation on a deck of a superblock, block or subblock of a three-dimensional (3D) non-volatile memory device to obtain an erased deck. At operation 904, the method includes applying a dummy read pulse to one or more wordlines (WLs) of a to-be-read deck of the superblock, block or subblock. At operation 906, the method includes implementing, after application of the dummy read pulse, a read operation on one or more memory cells corresponding to the one or more WLs to read data from the one or more memory cells. It is noted that embodiments do not necessarily require that a deck be erased prior to application of the dummy read pulse.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 102, external I/O controller 104, processor 108, cores 114A and 114B, I/O controller 110, CPU memory controller 112, storage device 106, system memory device 107, memory 116, memory devices 122, memory chips 123, controllers 126, storage device controller 118, address translation engine 120, program control logic 124, memory array 200, a page buffer, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Examples of Some Embodiments are Provided Below

Example 1 includes an apparatus comprising control circuitry to: implement an erase operation on a deck of a superblock, block or subblock of a three-dimensional (3D) non-volatile memory device to obtain an erased deck; apply a dummy read pulse to one or more wordlines (WLs) of a to-be-read deck of the superblock, block or subblock; and implement, after application of the dummy read pulse, a read operation on one or more memory cells corresponding to the one or more WLs to read data from the one or more memory cells.

Example 2 includes the subject matter of Example 1, and optionally, wherein the control circuitry is to implement an erase-suspend operation on a deck being erased prior to applying the dummy read pulse.

Example 3 includes the subject matter of Example 1, and optionally, wherein the control circuitry is to apply the dummy read pulse immediately after a start of the erase operation.

Example 4 includes the subject matter of Example 1, and optionally, wherein the control circuitry is to apply the dummy read pulse in response to a determination that a read operation is to be implemented.

Example 5 includes the subject matter of Example 1, and optionally, wherein the one or more WLs include all WLs of the superblock, block or subblock including WLs of the erased deck and of the to-be-read deck.

Example 6 includes the subject matter of Example 1, and optionally, wherein the one or more WLs include only WLs of the one or more memory cells.

Example 7 includes the subject matter of Example 1, and optionally, wherein the one or more WLs include all WLs of all to-be-read decks of the superblock, block or subblock.

Example 8 includes the subject matter of Example 1, and optionally, wherein the one or more WLs further include WLs of decks of the memory device providing a path to a source or drain of the superblock, block or subblock.

Example 9 includes the subject matter of Example 1, and optionally, wherein the control circuitry is to apply the dummy read pulse after a plurality of erase and read cycles with respect to the superblock, block or subblock, each erase and read cycle including an erase operation on a deck of the superblock, block or subblock that shares a pillar of the memory device with the one or more memory cells, and a read operation on the one or more memory cells.

Example 10 includes the subject matter of Example 7, and optionally, wherein the control circuitry is to apply the dummy read pulse at regular intervals after a predetermined number of erase and read cycles have been completed with respect to the superblock, block or subblock, each erase and read cycle including an erase operation on a deck of the superblock, block or subblock that shares a pillar of the memory device with the one or more memory cells, and a read operation on the one or more memory cells.

Example 11 includes the subject matter of Example 10, and optionally, wherein the predetermined number includes a number from 500 cycles up to 1000 cycles.

Example 12 includes a system including: a three-dimensional non-volatile memory device a superblock, block or subblock including: a plurality of decks stacked with respect to one another, each of the decks including a corresponding set of wordlines (WLs) and a corresponding set of interlayer dielectrics interposed between pairs of the corresponding set of WLs; and a plurality of pillars intersecting the wordlines and defining a plurality of memory cells therewith; and a controller coupled to the memory device, the controller to: implement an erase operation on a deck of the superblock, block or subblock to obtain an erased deck; apply a dummy read pulse to one or more wordlines (WLs) of a to-be-read deck of the superblock, block or subblock; and implement, after application of the dummy read pulse, a read operation on one or more memory cells of the plurality of memory cells to read data from the one or more memory cells, the one or more memory cells corresponding to the one or more WLs.

Example 13 includes the subject matter of Example 12, and optionally, wherein the controller is to implement an erase-suspend operation on a deck being erased prior to applying the dummy read pulse.

Example 14 includes the subject matter of Example 12, and optionally, wherein the controller is to apply the dummy read pulse immediately after a start of the erase operation.

Example 15 includes the subject matter of Example 12, and optionally, wherein the controller is to apply the dummy read pulse in response to a determination that a read operation is to be implemented.

Example 16 includes the subject matter of Example 12, and optionally, wherein the one or more WLs include all WLs of the superblock, block or subblock including WLs of the erased deck and of the to-be-read deck.

Example 17 includes the subject matter of Example 12, and optionally, wherein the one or more WLs include only WLs of the one or more memory cells.

Example 18 includes the subject matter of Example 12, and optionally, wherein the one or more WLs include all WLs of all to-be-read decks of the superblock, block or subblock.

Example 19 includes the subject matter of Example 12, and optionally, wherein the one or more WLs further include WLs of decks of the memory device providing a path to a source or drain of the superblock, block or subblock.

Example 20 includes the subject matter of Example 12, and optionally, wherein the controller is to apply the dummy read pulse after a plurality of erase and read cycles with respect to the superblock, block or subblock, each erase and read cycle including an erase operation on a deck of the superblock, block or subblock that shares a pillar of the memory device with the one or more memory cells, and a read operation on the one or more memory cells.

Example 21 includes the subject matter of Example 20, and optionally, wherein the controller is to apply the dummy read pulse at regular intervals after a predetermined number of erase and read cycles have been completed with respect to the superblock, block or subblock, each erase and read cycle including an erase operation on a deck of the superblock, block or subblock that shares a pillar of the memory device with the one or more memory cells, and a read operation on the one or more memory cells.

Example 22 includes the subject matter of Example 21, and optionally, wherein the predetermined number includes a number from 500 cycles up to 1000 cycles.

Example 23 includes a method including: implementing an erase operation on a deck of a superblock, block or subblock of a three-dimensional (3D) non-volatile memory device to obtain an erased deck; applying a dummy read pulse to one or more wordlines (WLs) of a to-be-read deck of the superblock, block or subblock; and implementing, after application of the dummy read pulse, a read operation on one or more memory cells corresponding to the one or more WLs to read data from the one or more memory cells.

Example 24 includes the subject matter of Example 23, and optionally, further including implementing an erase-suspend operation on a deck being erased prior to applying the dummy read pulse.

Example 25 includes the subject matter of Example 23, and optionally, further including applying the dummy read pulse immediately after a start of the erase operation.

Example 26 includes the subject matter of Example 23, and optionally, further including applying the dummy read pulse in response to a determination that a read operation is to be implemented.

Example 27 includes the subject matter of Example 23, and optionally, wherein the one or more WLs include all WLs of the superblock, block or subblock including WLs of the erased deck and of the to-be-read deck.

Example 28 includes the subject matter of Example 23, and optionally, wherein the one or more WLs include only WLs of the one or more memory cells.

Example 29 includes the subject matter of Example 23, wherein the one or more WLs include all WLs of all to-be-read decks of the superblock, block or subblock.

Example 30 includes the subject matter of Example 23, and optionally, wherein the one or more WLs further include WLs of decks of the memory device providing a path to a source or drain of the superblock, block or subblock.

Example 31 includes the subject matter of Example 23, and optionally, further including applying the dummy read pulse after a plurality of erase and read cycles with respect to the superblock, block or subblock, each erase and read cycle including an erase operation on a deck of the superblock, block or subblock that shares a pillar of the memory device with the one or more memory cells, and a read operation on the one or more memory cells.

Example 32 includes the subject matter of Example 31, and optionally, further including applying the dummy read pulse at regular intervals after a predetermined number of erase and read cycles have been completed with respect to the superblock, block or subblock, each erase and read cycle including an erase operation on a deck of the superblock, block or subblock that shares a pillar of the memory device with the one or more memory cells, and a read operation on the one or more memory cells.

Example 33 includes the subject matter of Example 32, and optionally, wherein the predetermined number includes a number from 500 cycles up to 1000 cycles.

Example 34 includes non-transitory machine readable storage medium having instructions stored thereon, the instructions when executed by a machine to cause the machine to: implement an erase operation on a deck of a superblock, block or subblock of a three-dimensional (3D) non-volatile memory device to obtain an erased deck; apply a dummy read pulse to one or more wordlines (WLs) of a to-be-read deck of the superblock, block or subblock; and implement, after application of the dummy read pulse, a read operation on one or more memory cells corresponding to the one or more WLs to read data from the one or more memory cells.

Example 35 includes the subject matter of Example 34, and optionally, the instructions to further cause the machine to implement an erase-suspend operation on a deck being erased prior to applying the dummy read pulse.

Example 36 includes the subject matter of Example 34, and optionally, the instructions to further cause the machine to apply the dummy read pulse immediately after a start of the erase operation.

Example 37 includes the subject matter of Example 34, and optionally, the instructions to further cause the machine to apply the dummy read pulse in response to a determination that a read operation is to be implemented.

Example 38 includes the subject matter of Example 34, and optionally, wherein the one or more WLs include all WLs of the superblock, block or subblock including WLs of the erased deck and of the to-be-read deck.

Example 39 includes the subject matter of Example 34, and optionally, wherein the one or more WLs include only WLs of the one or more memory cells.

Example 40 includes the subject matter of Example 34, and optionally, wherein the one or more WLs include all WLs of all to-be-read decks of the superblock, block or subblock.

Example 41 includes the subject matter of Example 34, and optionally, wherein the one or more WLs further include WLs of decks of the memory device providing a path to a source or drain of the superblock, block or subblock.

Example 42 includes the subject matter of Example 34, and optionally, the instructions to further cause the machine to apply the dummy read pulse after a plurality of erase and read cycles with respect to the superblock, block or subblock, each erase and read cycle including an erase operation on a deck of the superblock, block or subblock that shares a pillar of the memory device with the one or more memory cells, and a read operation on the one or more memory cells.

Example 43 includes the subject matter of Example 42, and optionally, the instructions to further cause the machine to apply the dummy read pulse at regular intervals after a predetermined number of erase and read cycles have been completed with respect to the superblock, block or subblock, each erase and read cycle including an erase operation on a deck of the superblock, block or subblock that shares a pillar of the memory device with the one or more memory cells, and a read operation on the one or more memory cells.

Example 44 includes the subject matter of Example 43, and optionally, wherein the predetermined number includes a number from 500 cycles up to 1000 cycles.

Example 45 includes a device comprising: one or more processors and one or more computer-readable media comprising instructions that, when executed by the one or more processors, cause the one or more processors to perform the method, techniques, or process as described in or related to any of the Examples above, or portions thereof.

Example 46 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 47 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising control circuitry to:
   implement an erase operation on a deck of a superblock, block or subblock of a three-dimensional (3D) non-volatile memory device to obtain an erased deck;
   apply, immediately after a start of the erase operation, a dummy read pulse to one or more wordlines (WLs) of a to-be-read deck of the superblock, block or subblock; and
   implement, after application of the dummy read pulse, a read operation on one or more memory cells corresponding to the one or more WLs to read data from the one or more memory cells.

2. The apparatus of claim 1, wherein the control circuitry is to implement an erase-suspend operation on a deck being erased prior to applying the dummy read pulse.

3. The apparatus of claim 1, wherein the one or more WLs include one of:
   all WLs of the superblock, block or subblock including WLs of the erased deck and of the to-be-read deck;
   only WLs of the one or more memory cells;

all WLs of all to-be-read decks of the superblock, block or subblock; or

WLs of decks of the memory device providing a path to a source or drain of the superblock, block or subblock.

4. The apparatus of claim 1, wherein the control circuitry is to apply the dummy read pulse after a plurality of erase and read cycles with respect to the superblock, block or subblock, each erase and read cycle including an erase operation on a deck of the superblock, block or subblock that shares a pillar of the memory device with the one or more memory cells, and a read operation on the one or more memory cells.

5. A system including:
a three-dimensional non-volatile memory device a superblock, block or subblock including:
  a plurality of decks stacked with respect to one another, each of the decks including a corresponding set of wordlines (WLs) and a corresponding set of interlayer dielectrics interposed between pairs of the corresponding set of WLs; and
  a plurality of pillars intersecting the WLs and defining a plurality of memory cells therewith; and
a controller coupled to the memory device, the controller to:
  implement an erase operation on a deck of the superblock, block or subblock to obtain an erased deck;
  apply, immediately after a start of the erase operation, a dummy read pulse to one or more WLs of a to-be-read deck of the superblock, block or subblock; and
  implement, after application of the dummy read pulse, a read operation on one or more memory cells of the plurality of memory cells to read data from the one or more memory cells, the one or more memory cells corresponding to the one or more WLs.

6. The system of claim 5, wherein the controller is to apply the dummy read pulse at regular intervals after a predetermined number of erase and read cycles have been completed with respect to the superblock, block or subblock, each erase and read cycle including an erase operation on a deck of the superblock, block or subblock that shares a pillar of the memory device with the one or more memory cells, and a read operation on the one or more memory cells.

7. The system of claim 6, wherein the predetermined number includes a number from 500 cycles up to 1000 cycles.

8. A method including:
implementing an erase operation on a deck of a superblock, block or subblock of a three-dimensional (3D) non-volatile memory device to obtain an erased deck;
applying, immediately after a start of the erase operation, a dummy read pulse to one or more wordlines (WLs) of a to-be-read deck of the superblock, block or subblock; and
implementing, after application of the dummy read pulse, a read operation on one or more memory cells corresponding to the one or more WLs to read data from the one or more memory cells.

9. The method of claim 8, further including implementing an erase-suspend operation on a deck being erased prior to applying the dummy read pulse.

10. The method of claim 8, further including applying the dummy read pulse in response to a determination that a read operation is to be implemented.

11. The method of claim 8, wherein the one or more WLs include all WLs of the superblock, block or subblock including WLs of the erased deck and of the to-be-read deck.

12. The method of claim 8, wherein the one or more WLs include only WLs of the one or more memory cells.

13. The method of claim 8, wherein the one or more WLs include all WLs of all to-be-read decks of the superblock, block or subblock.

14. The method of claim 8, wherein the one or more WLs further include WLs of decks of the memory device providing a path to a source or drain of the superblock, block or subblock.

15. The method of claim 8, further including applying the dummy read pulse after a plurality of erase and read cycles with respect to the superblock, block or subblock, each erase and read cycle including an erase operation on a deck of the superblock, block or subblock that shares a pillar of the memory device with the one or more memory cells, and a read operation on the one or more memory cells.

16. The method of claim 15, further including applying the dummy read pulse at regular intervals after a predetermined number of erase and read cycles have been completed with respect to the superblock, block or subblock, each erase and read cycle including an erase operation on a deck of the superblock, block or subblock that shares a pillar of the memory device with the one or more memory cells, and a read operation on the one or more memory cells.

17. A non-transitory machine readable storage medium having instructions stored thereon, the instructions when executed by a machine to cause the machine to:
  implement an erase operation on a deck of a superblock, block or subblock of a three-dimensional (3D) non-volatile memory device to obtain an erased deck;
  apply, immediately after a start of the erase operation, a dummy read pulse to one or more wordlines (WLs) of a to-be-read deck of the superblock, block or subblock; and
  implement, after application of the dummy read pulse, a read operation on one or more memory cells corresponding to the one or more WLs to read data from the one or more memory cells.

18. The machine readable storage medium of claim 17, wherein the one or more WLs include one of:
  all WLs of the superblock, block or subblock including WLs of the erased deck and of the to-be-read deck;
  only WLs of the one or more memory cells;
  all WLs of all to-be-read decks of the superblock, block or subblock; or
  WLs of decks of the memory device providing a path to a source or drain of the superblock, block or subblock.

* * * * *